(12) United States Patent
Prejbeanu et al.

(10) Patent No.: US 8,988,935 B2
(45) Date of Patent: Mar. 24, 2015

(54) SELF-REFERENCED MRAM CELL AND METHOD FOR WRITING THE CELL USING A SPIN TRANSFER TORQUE WRITE OPERATION

(71) Applicant: Crocus Technology SA, Grenoble Cedex (FR)

(72) Inventors: Ioan Lucian Prejbeanu, Seyssinet Pariset (FR); Kenneth Mackay, Le Sappey en Chartreuse (FR)

(73) Assignee: Crocus Technology SA, Grenoble (FR)

( * ) Notice: Subject to any disclaimer, the term of this patent is extended or adjusted under 35 U.S.C. 154(b) by 0 days.

(21) Appl. No.: 13/720,232

(22) Filed: Dec. 19, 2012

(65) Prior Publication Data

US 2013/0163318 A1 Jun. 27, 2013

(30) Foreign Application Priority Data

Dec. 22, 2011 (EP) .................................... 11290591

(51) Int. Cl.
*G11C 11/00* (2006.01)
*G11C 11/16* (2006.01)
(Continued)

(52) U.S. Cl.
CPC .......... *G11C 11/1675* (2013.01); *G11C 11/161* (2013.01); *G11C 11/5607* (2013.01); *H01F 10/3254* (2013.01); *H01F 10/3272* (2013.01); *H01F 10/329* (2013.01)
USPC ........... 365/158; 365/171; 365/173; 365/209; 365/211

(58) Field of Classification Search
CPC . G11C 11/16; G11C 11/1675; G11C 11/5607

USPC .......................... 365/158, 173, 171, 209, 211
See application file for complete search history.

(56) References Cited

U.S. PATENT DOCUMENTS 6,385,082 B1 * 5/2002 Abraham et al. ............. 365/171
6,744,086 B2 * 6/2004 Daughton et al. ............ 257/295
(Continued)

FOREIGN PATENT DOCUMENTS

EP 1244117 A2 9/2002

OTHER PUBLICATIONS

Dieny et al., "Spin-transfer effect and its use in spintronic components", Int. J Nanotechnol. vol. 7, p. 591 (2010).*
(Continued)

*Primary Examiner* — Viet Q Nguyen
(74) *Attorney, Agent, or Firm* — Pearne & Gordon LLP (57) ABSTRACT

The present disclosure concerns a method for writing to a self-referenced MRAM cell comprising a magnetic tunnel junction comprising: a storage layer including a first ferromagnetic layer having a first storage magnetization, a second ferromagnetic layer having a second storage magnetization, and a non-magnetic coupling layer separating the first and second ferromagnetic layers; a sense layer having a free sense magnetization; and a tunnel barrier layer included between the sense and storage layers; the first and second ferromagnetic layers being arranged such that a dipolar coupling between the storage) and the sense layers is substantially null; the method comprising: switching the second ferromagnetic magnetization by passing a spin-polarized current in the magnetic tunnel junction; wherein the spin-polarized current is polarized when passing in the sense layer, in accordance with the direction of the sense magnetization. The MRAM cell can be written with low power consumption.

18 Claims, 5 Drawing Sheets

(51) Int. Cl.
  *G11C 11/56* (2006.01)
  *H01F 10/32* (2006.01)

(56) References Cited

U.S. PATENT DOCUMENTS

| | | | | |
|---|---|---|---|---|
| 6,865,105 B1* | 3/2005 | Tran | | 365/158 |
| 6,865,109 B2* | 3/2005 | Covington | | 365/173 |
| 6,963,098 B2* | 11/2005 | Daughton et al. | | 257/295 |
| 6,963,500 B2* | 11/2005 | Tsang | | 365/171 |
| 7,006,375 B2* | 2/2006 | Covington | | 365/173 |
| 7,443,718 B2* | 10/2008 | Ito et al. | | 365/158 |
| 7,982,275 B2* | 7/2011 | Nagai et al. | | 257/421 |
| 8,120,947 B2* | 2/2012 | Wang et al. | | 365/158 |
| 8,339,843 B2* | 12/2012 | Katti | | 365/158 |
| 8,385,107 B2* | 2/2013 | Prejbeanu | | 365/158 |
| 8,456,895 B2* | 6/2013 | Abraham et al. | | 365/158 |
| 8,467,234 B2* | 6/2013 | Berger et al. | | 365/158 |
| 8,717,812 B2* | 5/2014 | Mackay et al. | | 365/171 |
| 8,743,597 B2* | 6/2014 | Prejbeanu et al. | | 365/158 |
| 8,754,491 B2* | 6/2014 | Abraham et al. | | 257/421 |
| 2002/0167059 A1* | 11/2002 | Nishimura et al. | | 257/421 |
| 2004/0246776 A1* | 12/2004 | Covington | | 365/173 |
| 2005/0237787 A1* | 10/2005 | Huai et al. | | 365/158 |
| 2007/0096229 A1* | 5/2007 | Yoshikawa et al. | | 257/421 |
| 2007/0097734 A1* | 5/2007 | Min et al. | | 365/158 |
| 2009/0147392 A1* | 6/2009 | Prejbeanu et al. | | 360/59 |
| 2009/0290413 A1* | 11/2009 | Prejbeanu | | 365/171 |
| 2010/0090261 A1* | 4/2010 | Zheng et al. | | 257/295 |
| 2010/0128520 A1* | 5/2010 | Zheng et al. | | 365/171 |
| 2011/0110151 A1* | 5/2011 | Prejbeanu | | 365/173 |
| 2012/0201074 A1* | 8/2012 | Berger et al. | | 365/158 |
| 2013/0077390 A1* | 3/2013 | Lombard et al. | | 365/158 |
| 2013/0148419 A1* | 6/2013 | Prejbeanu et al. | | 365/158 |

OTHER PUBLICATIONS

Prejbeanu et al., "Thermallly assisted MRAM", J. Phys. Condens. Matter 19, 165218 (2007).*
Prejbeanu et al., "Thermally assisted MRAM", J Phys: Condens. Matter, vol. 19, 165218 (2007).*
European Search Report dated Jul. 5, 2012 for application EP11290591.

* cited by examiner

SELF-REFERENCED MRAM CELL AND METHOD FOR WRITING THE CELL USING A SPIN TRANSFER TORQUE WRITE OPERATION

FIELD

The present invention concerns a method for writing to a self-referenced MRAM cell at low power consumption, using a spin-transfer torque write operation.

BACKGROUND

MRAM cells using the so-called self-referenced reading operation typically comprise a magnetic tunnel junction formed of a magnetic storage layer having a magnetization which direction can be changed from a first stable direction to a second stable direction, a thin insulating layer, and a sense layer having a magnetization with a reversible direction. Self-referenced MRAM cells allows for performing the write and read operation with low power consumption and an increased speed. Moreover, self-referenced MRAM cells are useful for making functional memories having a reduced yield as well as for high temperature and security applications.

However, a dipolar coupling between the storage and sense layers occurs due to local magnetic stray field, coupling the magnetization of the sense layer with the one of the storage layer in a closed magnetic flux configuration. Switching the sense layer magnetization will then require applying a magnetic field high enough to overcome the dipolar coupling. The dipolar coupling results in a shift (or bias) of the hysteresis loop when applying a field cycle to measure the hysteresis loop of the sense layer. This dipolar coupling depends on the thickness and magnetization of the storage and sense layers, and on the size of the magnetic tunnel junction. In particular, dipolar coupling increases with decreasing the magnetic tunnel junction diameter and can thus become a major issue when scaling down the MRAM cell.

The stray field generated by the storage layer on the sense layer results in increasing power consumption, especially during the read operation of the MRAM cell. Moreover, decreasing the stray field, for example using a synthetic storage layer, can result in an increase in the switching field of the magnetization of the sense layer.

SUMMARY

The present disclosure concerns a method for writing to a self-referenced MRAM cell comprising a magnetic tunnel junction comprising: a storage layer including a first ferromagnetic layer having a first storage magnetization, a second ferromagnetic layer having a second storage magnetization, and a non-magnetic coupling layer separating the first and second ferromagnetic layers; a sense layer having a free sense magnetization; and a tunnel barrier layer included between the sense and storage layers; the first and second ferromagnetic layers being arranged such that a dipolar coupling between the storage and the sense layers is substantially null; the method can comprise: switching the second ferromagnetic magnetization by passing a spin-polarized current in the magnetic tunnel junction; wherein the spin-polarized current is polarized when passing in the sense layer, in accordance with the direction of the sense magnetization.

In an embodiment, the direction of the sense magnetization can be determined by applying a magnetic field prior to said switching the second ferromagnetic magnetization.

In another embodiment, the sense layer can have a shape anisotropy or magnetocrystalline anisotropy such as to stabilize the direction of the sense magnetization.

In yet another embodiment, the switching direction of the second ferromagnetic magnetization can be determined by the polarity of the spin-polarized current.

In yet another embodiment, the direction of the sense magnetization can be determined by applying a magnetic field during said switching the second ferromagnetic magnetization.

In yet another embodiment, the direction of the sense magnetization can be determined by the direction of the applied magnetic field.

The method disclosed herein allows for writing to the MRAM cell with low power consumption.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
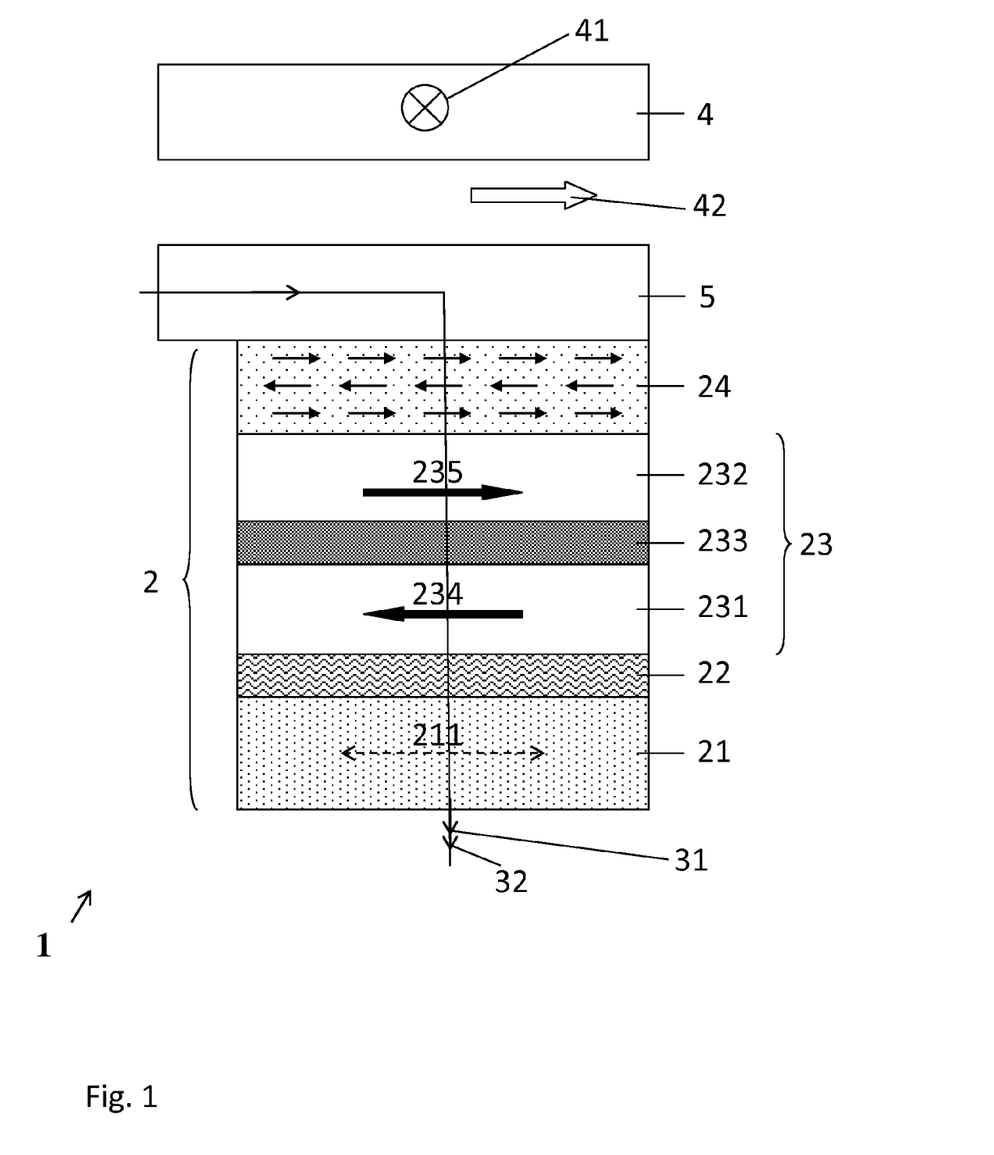
FIG. 1 represents a self-referenced MRAM cell 1 according to an embodiment.

FIG. 1 represents a self-referenced MRAM cell 1 according to an embodiment. The MRAM cell 1 comprises a magnetic tunnel junction 2 comprising a storage layer 23, a sense layer 21 having a free sense magnetization 211, and a tunnel barrier layer 22 included between the storage layer 23 and the sense layer 21. The storage layer 23 is preferably a synthetic storage layer comprising a first ferromagnetic layer 231 having a first storage magnetization 234, a second ferromagnetic layer 232 having a second storage magnetization 235, and a non-magnetic coupling layer 233 separating the first and second ferromagnetic layers 231, 232.

The dimensions (e.g., thickness) of the spacer layer 233 may be selected to cause the first and second ferromagnetic layers 231 and 232 to be magnetically coupled via RKKY coupling, such that the first ferromagnetic magnetization 234 is oriented antiparallel with the second ferromagnetic magnetization 234. The thickness may depend on the material that the spacer layer 233 is formed from. For example, the spacer layer 233 can comprise a non-magnetic material selected from the group comprising, for example, ruthenium (Ru), rhenium (Re), rhodium (Rh), tellurium (Te), yttrium (Y), chromium (Cr), iridium (Ir), silver (Ag), copper (Cu), etc. In an embodiment, the thickness may be comprised between about 0.2 nm and 3 nm. However, other thicknesses may be suitable to couple the two ferromagnetic layers 231 and 232. In a preferred embodiment, the spacer layer 233 comprises ruthenium (Ru) and has a thickness being comprised between 0.7 nm and 0.9 nm.

In the exemplary configuration of FIG. 1, the synthetic storage layer 23 is exchange coupled with an antiferromagnetic layer 24 such as to pin the second ferromagnetic magnetization 235 of the second ferromagnetic layer 232 at a low temperature threshold below a critical temperature, and to free it at a second high temperature threshold at or above the critical temperature. The antiferromagnetic layer 24 can be made from a manganese-based alloy, such as IrMn, PtMn, NiMn or FeMn, or any other suitable materials.

A dipolar coupling can occur between the storage layer 23 and the sense layer 21. Such dipolar coupling is caused by a local magnetic stray field (not shown) induced by the first and second ferromagnetic magnetizations 234, 235. The magnitude of the dipolar coupling depends on the respective thicknesses of the first and second ferromagnetic layers 231, 232. The magnitude of the dipolar coupling can also be varied by selecting magnetic materials of the first and second ferromagnetic layers 231, 232 having various spontaneous magnetizations such as, but not exclusively, Fe, Co, Ni and their alloys such as FeCo, NiFe, FeCoB, FeCoNi or FeCoCr.

In an embodiment, the thickness of the first and second ferromagnetic layers 231, 232 are selected such that the dipolar coupling, and thus stray field, is substantially null. In this configuration, the synthetic storage layer 23 can be said to be completely compensated.

According to an embodiment, a thermally assisted switching (TAS) write operation comprises:

heating the magnetic tunnel junction 2 to a high temperature threshold;

once the magnetic tunnel junction 2 has reached the high temperature threshold, switching the second ferromagnetic magnetization 235 in the written state; and cooling the magnetic tunnel junction 2 to the low temperature threshold such as to freeze the second ferromagnetic magnetization 235 in the written state.

Heating the magnetic tunnel junction 2 can be performed by passing a heating current 31 in the magnetic tunnel junction 2, via a current line 5 in electrical communication with the magnetic tunnel junction 2.

In an embodiment, the written MRAM cell 1 can be read using a self-referenced read operation comprising:

adjusting the sense magnetization 211 in a first read direction;

measuring a first junction resistance value $R_1$;

adjusting the sense magnetization 211 in a second read direction; and measuring a second junction resistance value $R_2$.

Adjusting the sense magnetization 211 in a first read direction can comprise applying a magnetic field 42 having a first polarity by passing a field current 41 with a first polarity in a field line 4. Adjusting the sense magnetization 211 in a second read direction can comprise applying the read magnetic field 42 having a second polarity, opposed to the first polarity, by passing the field current 41 with a second polarity, opposed to the first polarity, in the field line 4. The magnetic field 42 is applied at a read temperature that is below the first critical temperature, for example that can correspond to the low temperature threshold, where the second storage magnetization 235 is being pinned by the first antiferromagnetic layer 24. Measuring the first and second junction resistance values $R_1$, $R_2$ can be performed by passing a sense current 32 in the magnetic tunnel junction 2 via the current line 5. Alternatively, the field current 41 can be passed in the current line 5.

Figure 2:
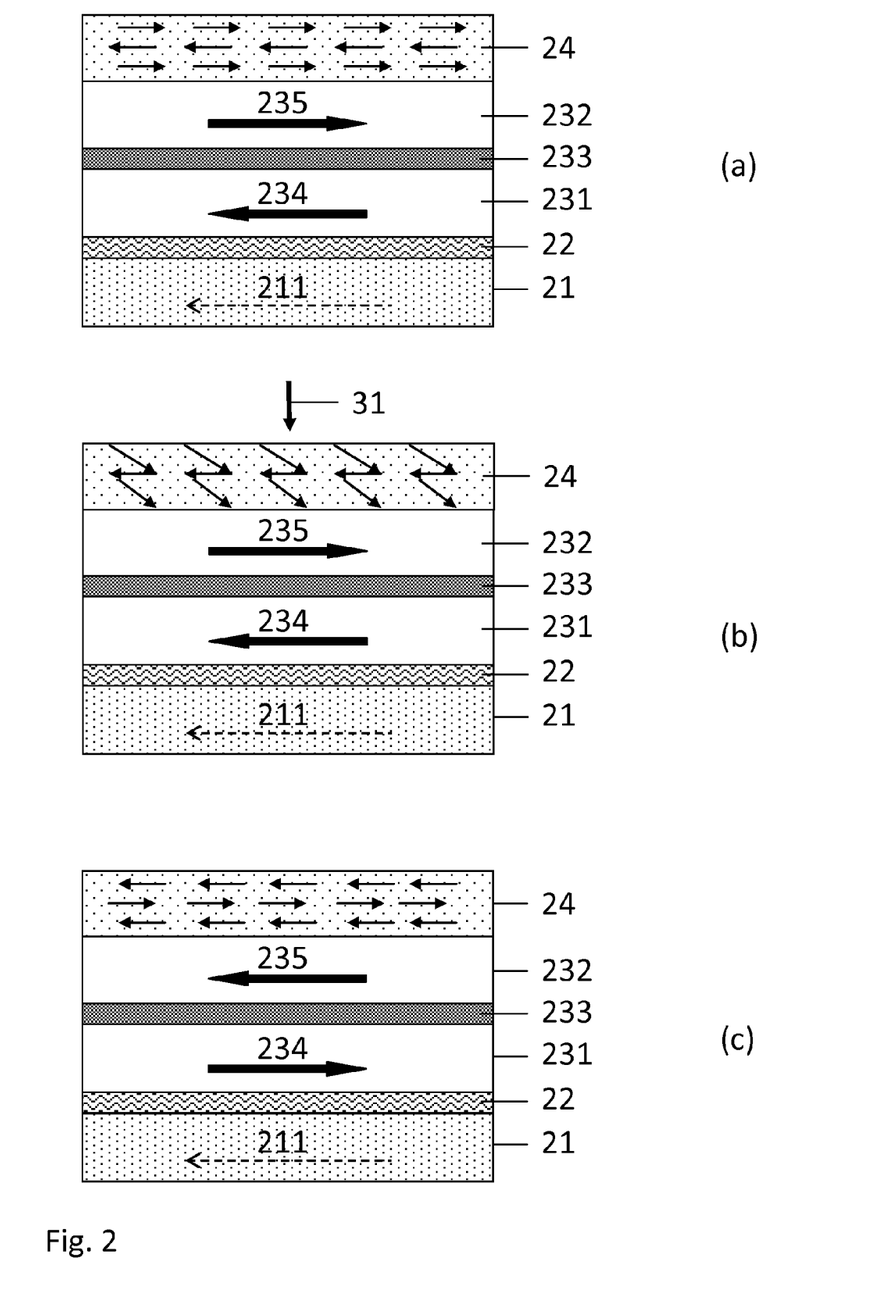
FIGS. 2 and 3 illustrate the write operation based on spin-transfer torque (STT), according to an embodiment.
Figure 3:
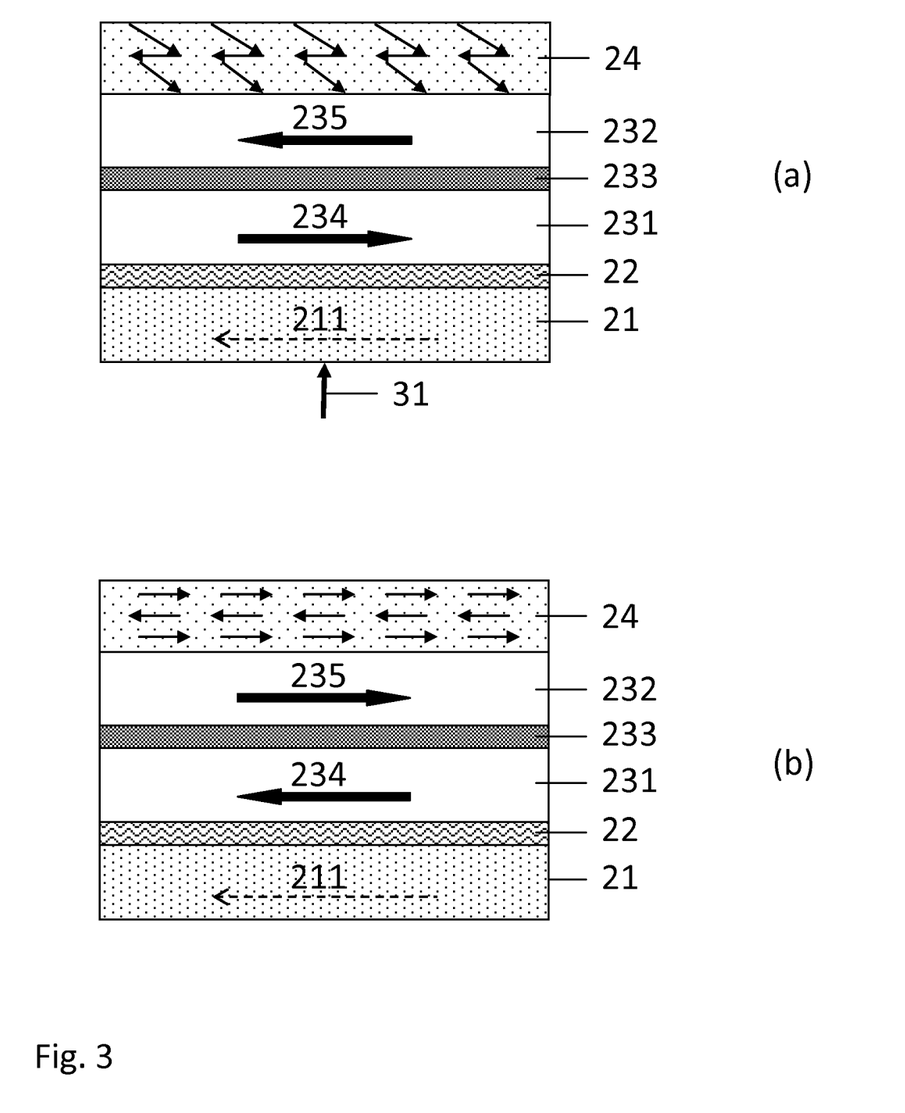

FIGS. 2 and 3 illustrate the write operation based on spin-transfer torque (STT), according to an embodiment in which the sense layer 21 is used as a polarizing layer. During the STT-based write operation switching the first ferromagnetic magnetization 234 comprises injecting a spin-polarized current 31 in the magnetic tunnel junction 2, for example, via the current line 5. The spins of the spin-polarized current 31 become mostly oriented along the magnetization direction of the sense magnetization 211. The spin-polarized current 31 exerts a torque on the first ferromagnetic magnetization 234, switching the first ferromagnetic magnetization 234 in a direction corresponding to the orientation of the sense magnetization 211. In a preferred embodiment, the sense layer 21 has a thickness that is greater that the thickness of the first ferromagnetic layer 231 being in contact with the tunnel barrier layer 22.

More particularly, FIG. 2 (a) shows the MRAM cell 1 in an initial state where the first and second ferromagnetic magnetizations 234, 235 are oriented antiparallel and where the sense magnetization 211 is oriented towards the left of the figure. The orientation of the sense magnetization 211 can be determined, for example, by the magnetic field 42 applied during the read operation prior to the write operation. The orientation of the sense magnetization 211 can be made stable by a shape anisotropy of the sense layer 21, for example, the sense layer 21 having an elliptical shape; or due to magnetocrystalline anisotropy.

FIG. 2 (b) represents the MRAM cell 1 where the spin-polarized current 31 having a first polarity is injected in the magnetic tunnel junction 2. The spin-polarized current 31 becomes polarized when passing through the sense layer 21 according to the first polarity of the spin-polarized current 31. In this configuration, the spin-polarized current 31 exerts a torque on the first ferromagnetic magnetization 234 switching the first ferromagnetic magnetization 234 in a direction corresponding to the orientation of the sense magnetization 211. The second ferromagnetic magnetization 235 is thus switched in a direction opposed to that of the direction of the sense magnetization 211, such as to remain antiparallel with the second ferromagnetic magnetization 234 due to the RKKY coupling.

FIG. 2 (c) represents the MRAM cell 1 in a first written state, where the second ferromagnetic magnetization 235 has been switched in a direction opposed to that of the sense magnetization 211. After writing, the first antiferromagnetic layer 24 becomes oriented substantially parallel to the magnetization 235 of the ferromagnetic layer 232.

FIG. 3 (a) represents the MRAM cell 1 in the written state of FIG. 2 (c), where the spin-polarized current 31 having a second polarity is injected through the magnetic tunnel junction 2. The spin-polarized current 31 becomes polarized when passing through the sense layer 21 according to the second polarity of the spin-polarized current 31. In this configuration, the spin-polarized current 31 switches the first ferromagnetic magnetization 234 in a direction opposed to the first written direction, or to the orientation of the sense magnetization 211.

FIG. 3 (b) represents the MRAM cell 1 in a second written state, where the first ferromagnetic magnetization 234 has been switched in accordance with the spin-polarized current 31 having the second polarity. Again, the second ferromagnetic magnetization 235 is also switched such as to remain antiparallel with the first ferromagnetic magnetization 234 due to the RKKY coupling.

An advantage of the STT-based write operation according to the present embodiment is that the write operation can be performed in the absence of magnetic field. However, the STT-based write operation according to the present embodiment requires using a bipolar transistor for injecting the bidirectional spin-polarized current 31. The read operation may also require the magnetic field 42 to have a larger magnitude due to the shape and/or magneto crystalline anisotropy of the sense layer 21.

Figure 4:
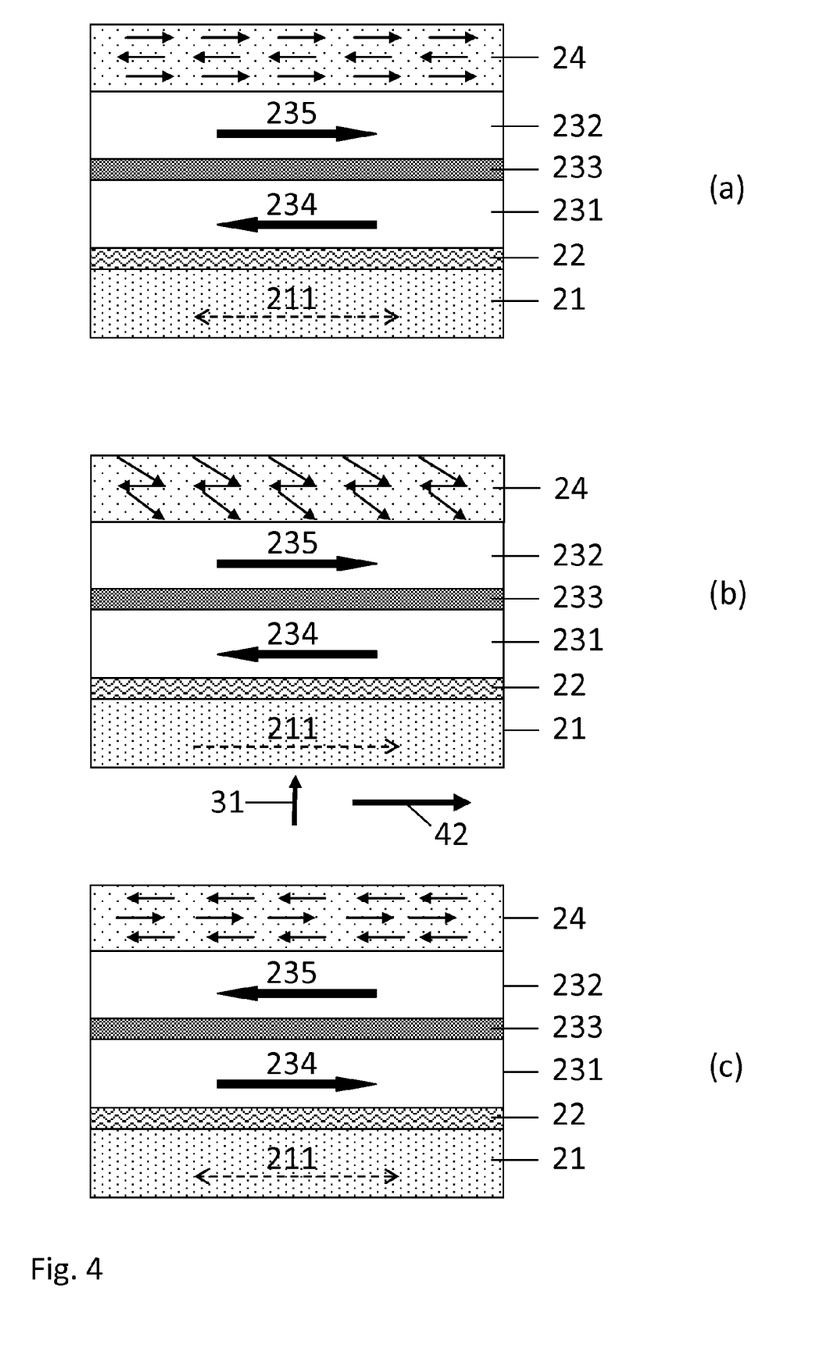
FIGS. 4 and 5 illustrate the STT-based write operation according to another embodiment.
Figure 5:
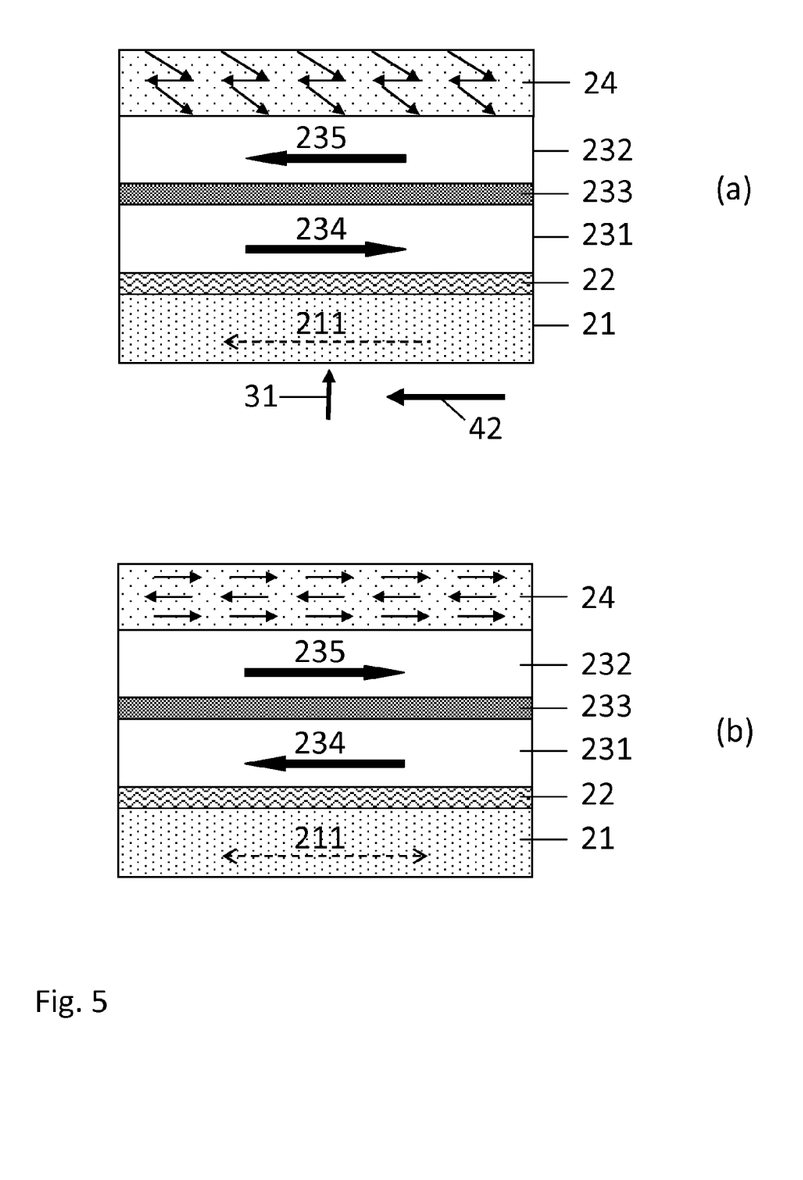

FIGS. 4 and 5 illustrate the STT-based write operation according to another embodiment. More particularly, FIG. 4 (a) shows the MRAM cell 1 in an initial state where the first and second ferromagnetic magnetizations 234, 235 are oriented antiparallel and where the sense magnetization 211 is oriented towards the left of the figure.

FIG. 4 (*b*) represents the MRAM cell 1 where a magnetic field 42 is applied such as to orient the sense magnetization 211 in accordance with the magnetic field 42. The spin-polarized current 31 is injected through the magnetic tunnel junction 2 when applying the magnetic field 42. The spin-polarized current 31 becomes polarized when passing through the sense layer 21 in accordance with the orientation of sense magnetization 211 determined by the magnetic field 42. The spin-polarized current exerts a torque on the first ferromagnetic magnetization 234 switching the first ferromagnetic magnetization 234 in a direction corresponding to the orientation of the sense magnetization 211. The magnetic field 42 is small enough to allow switching only the sense magnetization 211 and not the first ferromagnetic magnetization 234. In the example of FIG. 4 (*b*), the magnetic field can be applied oriented toward the right by passing the field current 41 entering the page in the field line 4, as illustrated in FIG. 1.

FIG. 4 (*c*) represents the MRAM cell 1 in the written state, where the first ferromagnetic magnetization 234 has been switched in accordance with the direction of the sense magnetization 211. The second ferromagnetic magnetization 235 is also switched such as to remain antiparallel with the first ferromagnetic magnetization 234 due to the RKKY coupling.

FIG. 5 (*a*) represents the MRAM cell 1 in the written state of FIG. 4 (*c*), where the spin-polarized current 31 injected in the magnetic tunnel junction 2 has the same polarity as the one in FIG. 4 (*b*). In FIG. 5 (*a*), the magnetic field 42 is applied with a direction opposed to the one of FIG. 4 (*b*) such that the sense magnetization is oriented in a direction opposed to the one of FIG. 4 (*b*). The spin-polarized current 31 being polarized in accordance with the orientation of sense magnetization 211 switches the first ferromagnetic magnetization 234 in a direction opposed to its direction in the first written state of FIG. 5 (*a*).

FIG. 5 (*b*) represents the MRAM cell 1 in the second written state, where the first ferromagnetic magnetization 234 has been switched in accordance with the spin-polarized current 31 and of the applied magnetic field 42. The second ferromagnetic magnetization 235 is also switched such as to remain antiparallel with the first ferromagnetic magnetization 234 due to the RKKY coupling.

An advantage of the STT-based write operation according to the present embodiment is that injecting the unidirectional spin-polarized current 31 can be performed using a unipolar transistor that is smaller than a bipolar transistor and has lower power consumption. The read operation also requires using the magnetic field 42 having a smaller magnitude. However, the write operation requires using the magnetic field 42.

REFERENCE NUMBERS

1 magnetic random access memory (MRAM) cell
2 magnetic tunnel junction
21 sense layer
211 sense magnetization
22 tunnel barrier layer
23 storage layer
231 first ferromagnetic layer
232 second ferromagnetic layer
233 spacer layer
234 first ferromagnetic magnetization
235 second ferromagnetic magnetization
24 antiferromagnetic storage layer
31 spin polarized current
32 sense current
4 field line
41 field current
42 magnetic field
5 current line

The invention claimed is:

1. Method for writing to a self-referenced MRAM cell comprising a magnetic tunnel junction comprising:
    a storage layer including a first ferromagnetic layer having a first storage magnetization, a second ferromagnetic layer having a second storage magnetization, and a non-magnetic coupling layer separating the first and second ferromagnetic layers;
    a sense layer having a free sense magnetization; and
    a tunnel barrier layer included between the sense and storage layers;
    the first and second ferromagnetic layers being arranged such that a dipolar coupling between the storage and the sense layers is substantially null;
    the magnetic tunnel junction further comprising an antiferromagnetic layer exchange coupling the second ferromagnetic layer such as to pin the second storage magnetization at a low temperature threshold and to free it at a second high temperature threshold;
    the method comprising the steps of:
    heating the magnetic tunnel junction to the high temperature threshold;
    applying a magnetic field to orientate the sense magnetization in a predefined direction corresponding to a desired direction of polarization for a spin-polarized current, wherein the magnitude of the applying a magnetic field is such that it can adjust the direction of the sense magnetization only and not the second storage magnetization;
    once the magnetic tunnel junction has reached the high temperature threshold, switching the first storage magnetization by passing a spin-polarized current in the magnetic tunnel junction, wherein the direction in which the first ferromagnetic magnetization is switched depends on the polarity of the spin-polarized current;
    the spin-polarized current being polarized only when passing in the sense layer in accordance with the direction of the sense magnetization, and being non-polarized before it passes through the sense layer.

2. Method according to claim 1, wherein
    the direction of the sense magnetization is determined by applying a magnetic field prior to said switching the first storage magnetization.

3. Method according to claim 2, wherein
    the sense layer has a shape anisotropy or magnetocrystalline anisotropy such as to stabilize the direction of the sense magnetization.

4. Method according to claim 1, wherein
    the switching direction of the first storage magnetization is determined by the polarity of the spin-polarized current.

5. Method according to claim 1, wherein
    the direction of the sense magnetization is determined by applying a magnetic field during said switching the first storage magnetization.

6. Method according to claim 5, wherein
    the direction of the sense magnetization is determined by the direction of the applied magnetic field.

7. Method according to claim 1, further comprising the step of cooling the magnetic tunnel junction to the low temperature threshold such as to freeze the first storage magnetization in the written state.

8. Method according to claim 1, wherein
heating the magnetic tunnel junction is performed by passing a heating current in the magnetic tunnel junction, via a current line in electrical communication with the magnetic tunnel junction.

9. Method according to claim 1 wherein the polarity of the spin-polarized current is defined by the orientation of the spins in the spin-polarized current.

10. Method according to claim 9 wherein the step of the spin-polarized current being polarized, when passing in the sense layer, in accordance with the direction of the sense magnetization, comprises orientating the spins of the spin-polarized current, using the sense magnetization, so that the spins are mostly oriented along the magnetization direction of the sense magnetization.

11. Method for writing to a self-referenced MRAM cell comprising a magnetic tunnel junction comprising:
a storage layer including a first ferromagnetic layer having a first storage magnetization, a second ferromagnetic layer having a second storage magnetization, and a non-magnetic coupling layer separating the first and second ferromagnetic layers;
a sense layer having a free sense magnetization; and
a tunnel barrier layer included between the sense and storage layers;
the first and second ferromagnetic layers being arranged such that a dipolar coupling between the storage and the sense layers is substantially null;
the magnetic tunnel junction further comprising an antiferromagnetic layer exchange coupling the second ferromagnetic layer such as to pin the second storage magnetization at a low temperature threshold and to free it at a second high temperature threshold;
the method comprising the steps of:
applying a magnetic field to orientate the sense magnetization in a predefined direction corresponding to a desired direction of polarization for a spin-polarized current, wherein the magnitude of the applying a magnetic field is such that it can adjust the direction of the sense magnetization only and not the second storage magnetization;
heating the magnetic tunnel junction to the high temperature threshold by passing a heating current in the magnetic tunnel junction, via a current line in electrical communication with the magnetic tunnel junction, wherein the direction in which the first ferromagnetic magnetization is switched depends on the polarity of the spin-polarized current;
once the magnetic tunnel junction has reached the high temperature threshold, switching the first storage magnetization by passing a spin-polarized current in the magnetic tunnel junction;
determining the direction of the sense magnetization by applying a magnetic field prior to said switching the first storage magnetization, such that the spin-polarized current is polarized when passing in the sense layer in accordance with the direction of the sense magnetization, and being non-polarized before it passes through the sense layer; and
cooling the magnetic tunnel junction to the low temperature threshold such as to freeze the first storage magnetization in the written state.

12. Method according to claim 11, wherein the sense layer has a shape anisotropy or magnetocrystalline anisotropy such as to stabilize the direction of the sense magnetization.

13. Method according to claim 11 wherein the polarity of the spin-polarized current is defined by the orientation of the spins in the spin-polarized current.

14. Method according to claim 13 wherein the step of the spin-polarized current being polarized, when passing in the sense layer, in accordance with the direction of the sense magnetization, comprises orientating the spins of the spin-polarized current, using the sense magnetization, so that the spins are mostly oriented along the magnetization direction of the sense magnetization.

15. Method for writing to a self-referenced MRAM cell comprising a magnetic tunnel junction comprising:
a storage layer including a first ferromagnetic layer having a first storage magnetization, a second ferromagnetic layer having a second storage magnetization, and a non-magnetic coupling layer separating the first and second ferromagnetic layers;
a sense layer having a free sense magnetization; and
a tunnel barrier layer included between the sense and storage layers;
the first and second ferromagnetic layers being arranged such that a dipolar coupling between the storage and the sense layers is substantially null;
the magnetic tunnel junction further comprising an antiferromagnetic layer exchange coupling the second ferromagnetic layer such as to pin the second storage magnetization at a low temperature threshold and to free it at a second high temperature threshold;
the method comprising the steps of:
heating the magnetic tunnel junction to the high temperature threshold by passing a heating current in the magnetic tunnel junction, via a current line in electrical communication with the magnetic tunnel junction;
applying a magnetic field to orientate the sense magnetization in a predefined direction corresponding to a desired direction of polarization for a spin-polarized current, wherein the magnitude of the applying a magnetic field is such that it can adjust the direction of the sense magnetization only and not the second storage magnetization;
once the magnetic tunnel junction has reached the high temperature threshold, switching the first storage magnetization by passing a spin-polarized current in the magnetic tunnel junction, wherein the direction in which the first ferromagnetic magnetization is switched depends on the polarity of the spin-polarized current;
determining the direction of the sense magnetization wherein the direction of the sense magnetization is determined by applying a magnetic field during said switching the first storage magnetization; and
cooling the magnetic tunnel junction to the low temperature threshold such as to freeze the first storage magnetization in the written state.

16. Method according to claim 15, wherein
the direction of the sense magnetization is determined by the direction of the applied magnetic field.

17. Method according to claim 15 wherein the polarity of the spin-polarized current is defined by the orientation of the spins in the spin-polarized current.

18. Method according to claim 17 wherein the step of the spin-polarized current being polarized only when passing in the sense layer in accordance with the direction of the sense magnetization, and being non-polarized before it passes through the sense layer, comprises orientating the spins of the spin-polarized current, using the sense magnetization, so that the spins are mostly oriented along the magnetization direction of the sense magnetization.

* * * * *